United States Patent [19]

Hillenbrand et al.

[11] Patent Number: 4,862,087
[45] Date of Patent: Aug. 29, 1989

[54] PROCESS AND APPARATUS FOR HOMOGENIZING A STATIC MAGNETIC FIELD

[75] Inventors: David F. Hillenbrand, Groveland, Mass.; Piotr M. Starewicz, North Plainfield, N.J.

[73] Assignee: Resonance Research, Inc., Billerica, Mass.

[21] Appl. No.: 182,953

[22] Filed: Apr. 18, 1988

[51] Int. Cl.$^4$ ............................................. G01R 33/20
[52] U.S. Cl. ..................................... 324/320; 324/319
[58] Field of Search ............... 324/300, 307, 309, 308, 324/318, 319, 320, 322; 128/653

[56] References Cited

U.S. PATENT DOCUMENTS

| | | | |
|---|---|---|---|
| 4,581,580 | 4/1986 | Keim | 324/320 |
| 4,673,882 | 6/1987 | Buford | 324/320 |
| 4,749,948 | 6/1988 | Duby et al. | 324/320 |

*Primary Examiner*—Michael J. Tokar
*Attorney, Agent, or Firm*—Paul J. Cook

[57] ABSTRACT

Apparatus such as high resolution nuclear magnetic resonance apparatus is provided which includes a large volume having a homogeneous static magnetic field generated by a solenoid magnet within which a plurality of stationary samples can be analyzed concomitantly. The static magnetic field is rendered homogeneous by means of a plurality of radial and axial coils connected to a controlled power supply.

3 Claims, 2 Drawing Sheets

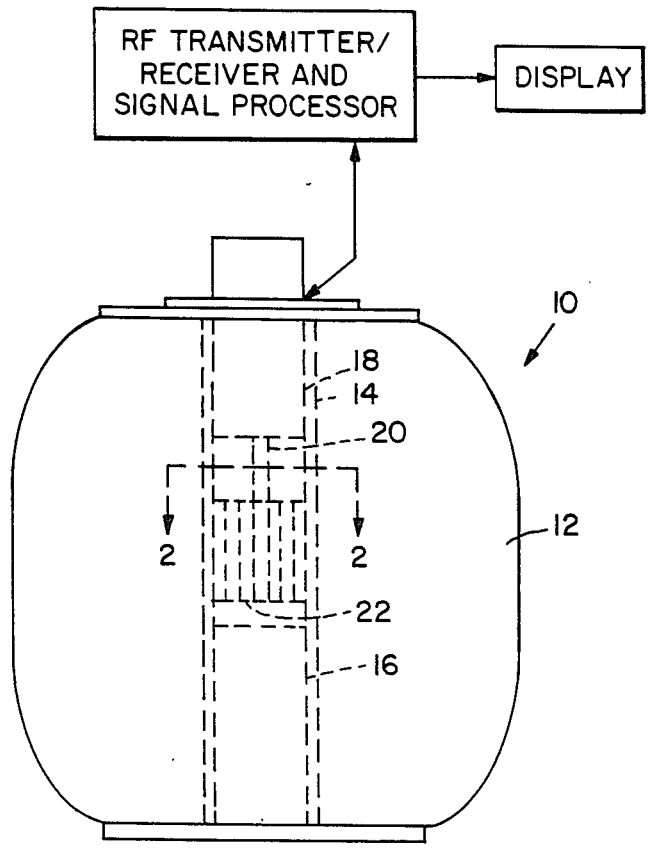
Fig. 1
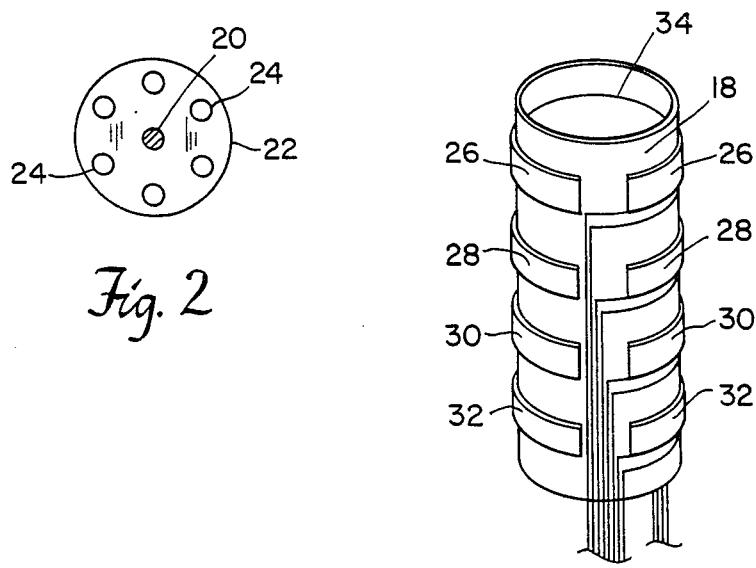
Fig. 2
Fig. 3

PROCESS AND APPARATUS FOR HOMOGENIZING A STATIC MAGNETIC FIELD

BACKGROUND OF THE INVENTION

This invention relates to a process and apparatus having a homogeneous magnetic field and more particularly to apparatus having a homogeneous magnetic field within which experimentation or sample analysis can be conducted.

A variety of apparatus utilize a static magnetic field within which experimentation or sample analysis is conducted. Examples of such apparatus include high resolution nuclear magnetic resonance apparatus, magnetic imaging apparatus, ion cyclotron mass spectrometry apparatus or the like. In this apparatus, it is desirable to homogenize the static magnetic field in order to minimize anomalies in measurements.

Nuclear magnetic resonance (NMR) is the resonance effect of an alternating magnetic field at right angles to a stronger static magnetic field to change the orientation of nuclear magnetic moments within the static magnetic field. The alternating magnetic field generally is applied as the magnetic component of a radio frequency field which can be applied in a continuous manner over a frequency range or which can be applied as pulses over a frequency range. The applied magnetic field causes an induced signal from the nuclear induction which signal is uniquely characteristic for a given nucleus. In order for the measured induced nuclear magnetism to accurately reflect the characteristic of the nuclear sample, it is essential that the static magnetic field be homogeneous.

The use of currents in coils of varying geometry to establish magnetic field uniformity (homogeneity) is an established practice. Such practice has resulted in design and utilization of space efficient coils for simultaneous control of various axial gradients of the magnetic field in which each coil addresses more than one axial gradient of the field. Conventional practice of design and utilization of coils for control of radial gradients of the magnetic field have extended to gradients of relatively lower order and typically uses designs in which each coil assembly is used for only one radial gradient of the magnetic field; a spatially inefficient approach if a relatively large number of gradients are to be controlled.

Prior to the present invention, those anomalies in the homogeneity of the static field of nuclear magnetic resonance apparatus not treatable with conventional coils were averaged out by spinning the sample within the most homogeneous volume of the static field. This procedure is undesirable since it requires mechanical apparatus which may itself produce anomalies during measurements due to variations in spin velocity and to slight movements of the spin axis. In addition, the use of apparatus for spinning the sample is undesirably cumbersome.

It has been proposed in U.S. Pat. No. 4,654,592 to analyze a plurality of samples by NMR wherein the samples are arrayed axially along the z axis of a room temperature bore located within a superconducting magnet. Such apparatus also requires the loading of descrete samples within the sample cell in advance; and inconvenience. The apparatus permits analysis of a plurality of samples simultaneously. However, the apparatus requires that the samples be spun continuously during analysis thereby necessitating the use of suitable mechanical spinning apparatus.

It would be desirable to provide a method and apparatus for analyzing a plurality of samples by NMR simultaneously or concomitantly in a high resolution NMR apparatus which avoids the necessity of spinning the sample. Furthermore, it would be desirable to provide such an NMR apparatus having a relatively large volume of homogeneous static magnetic field so that a plurality of samples can be analyzed simultaneously or concomitantly. In addition, it would be desirable to provide a homogeneous static magnetic field in apparatus requiring a static magnetic field in order that larger samples can be analyzed.

SUMMARY OF THE INVENTION

In accordance with this invention, there is provided apparatus for homogenizing a static magnetic field. In one embodiment, the present invention provides high resolution nuclear magnetic resonance apparatus for concurrent analysis of discrete sample. The apparatus includes a nuclear magnetic resonance analyzer adapted to concomitantly analyze a plurality of samples at rest which are located in radially discrete positions. A sample container is provided which is adapted to retain a plurality of discrete samples wherein the samples are retained in radially discrete positions within a volume having a substantially homogeneous static magnetic field. Alternatively, a plurality of samples can be pumped in sequence through one or more sample retainers within the sample container without spinning the samples. The pumped samples are interspersed with pumped washing fluid. The homogeneous static magnetic field in the NMR apparatus or other apparatus utilizing a static magnetic field is provided by means of a solenoidal geometry magnet which is complemented by a plurality of radial and axial coils connected to a controlled power supply in order to produce controlled magnetic field gradients. The radial and axial coils as well as the means for providing current thereto are such as to zero out a plurality of higher and lower order gradients of the static magnetic field.

BRIEF DESCRIPTION OF THE DRAWINGS

FIG. 1 is a block diagram of an NMR apparatus utilizing this invention.

FIG. 2 is a cross-sectional view of a sample holder of this invention taken along line 2—2 of FIG. 1.

FIG. 3 is a hollow cylinder of this invention for securing radial coils of this invention.

DESCRIPTION OF SPECIFIC EMBODIMENTS

Figure 4:
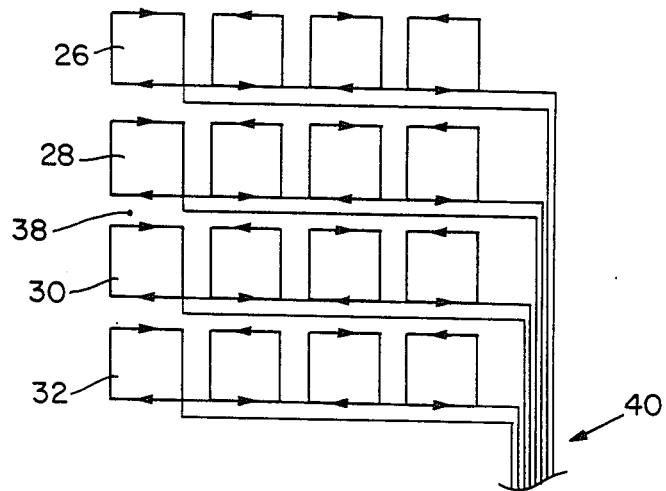
FIG. 4 is a schematic view of the radial coils shown in FIG. 3 to zero out magnetic gradients.

The present invention will be described specifically herein in terms of an NMR apparatus. However, it is to be understood that this invention is useful in any apparatus utilizing a static magnetic field in which homogeneous magnetic fields are desirable.

In accordance with this invention, a relatively large volume of a homogeneous static magnetic field is provided by utilizing radial and axial coils positioned within a room temperature bore of a magnet.

The position and design of the coils which are connected to a controlled power supply as a well as the current to be provided from the power supply during use is determined by the symmetries of the homogeneity terms to be controlled by an individual assembly and by utilizing a mathematical model to first calculate the field produced from a radial coil composed of those placed at particular radial phase angles and axial positions. The radial magnetic coils are composed of saddle shaped coils while the axial magnetic coils are circular components each formed from multiwinds of wire. Suitable field equations which are useful for designing the coils are obtainable from the Laplace or Poisson equations for an arc of wire placed at a given radius having a given arc length and a given height from the center of the static magnetic field. The field generated by the coil is calculated for each arc or circle coil and the contributions from the arcs or circles is summed to determine the magnetic field generated by the radial coils or axial coils. The magnetic field generated by the radial coils within the central volume of the static magnetic field can be determined from a sufficient number of gradients of the field at the center thereof by expanding the field such as utilizing a Taylor series or a spherical harmonic expansion. In this procedure, the terms of the expansion are equated order by order to determine the field gradients and the terms of the spherical harmonic expansion coefficients. The spherical harmonic expansion coefficients are set forth in equation 1.

$$H_z = \sum_{m=1}^{\infty} \sum_{m=0}^{n} r^{n-1} [(n-m)\cos\theta \, P_n^m (\cos\theta) +$$

$$\sin\theta P_n^{m+1} (\cos\theta)]$$

$$[A_n^m \cos m\phi + B_n^m \sin e\, m\phi]$$

The spherical harmonic functions, $p_n^m$ and $p_n^m+1$ are expressed in terms of cosine $\theta$. The coefficients $A_n^m$ and $B_n^m$ express the amount of each spherical harmonic actually observed, r, $\theta$ and $\phi$ are cylindrical coordinates of the point at which the field is being sampled. $\theta$ is the angle in the x y plane and $\phi$ is the z angle. n and m are indices to which the spherical harmonic term is being referred. The Taylor expansion and the spherical harmonic expansion are equal to each other since both describe the field. Therefore, one can allow the gradients to be grouped according to each term of the spherical harmonic expansion.

After the radial and axial coils have been designed and placed on a cylinder, they are placed within the static magnetic field and the magnetic field resulting from the static magnetic field and the radial and axial coils having current therethrough is mapped at a number of points to determine experimentally what the strength of each coefficient is of each term of the spherical harmonic expansion. Since the experimental coefficient is known and it is known which gradients relate to each term of the expansion, and the power to each coil has been calculated from the model for each gradient, one can determine the gradient in terms of power/ampere for each term from the model. Since one has the experimental results of the strength, one can determine the amperes required to each coil for each term of the spherical harmonic expansion. Therefore, one can calculate the strength/ ampere need to be supplied to each coil in order to effect cancelation of magnetic gradients in the static magnetic field.

In the case of NMR apparatus mapping of the static magnetic field can be effected by utilizing a R F probe which is inserted into the room temperature bore of the magnet to obtain magnetic field measurements at varying radial position at varying heights within the magnetic field. The magnetic field measurements are obtained at axial heights within the bore on both sides of the theoretical zero point of the static magnetic field. Typically, measurements are taken at a radius extending from the axial center of the bore and at evenly spaced radial angles about the circumference of the bore, e.g., at 30° intervals at 1–3 cm from the axial center and at varying heights surrounding the static magnetic field center.

The above described process leads to a geometry comprising a plurality of sets of coils wherein each set comprises an even number of coils comprising at least two coils and wherein each set is designed to zero out a particular magnetic field gradient. Each set of coils has one coil positioned above the zero point of the magnetic field and one coil below the zero point of the magnetic field. Mapping the open room temperature bore has advantages in that it utilizes a clear observable to determine a number of gradients and leaves a set of current settings that is substantially independent of operator skill. This procedure also establishes the field independently of the probe that will be used in experimental work subsequently so that when the subsequently utilized probe has non-zero susceptibility, small changes in the current setting must be introduced to compensate approximately for this non-zero susceptibility. However, this is not a problem since the advantage is that the field settings decouple the results from the probe and if a subsequently used probe provides anomalous values, the operator knows that the probe is anomalous and not the magnetic field.

In the present invention, the coils are wound separately rather than in series or are wound separately in sets wherein the coils of a set are distributed symmetrically around the circumference of the static magnetic field. The product of current and turns in each coil is varied so that the ampere-turn product can be varied easily by adjusting the current to each coil. The current to each coil can be varied by adjusting the voltage in the circuit. Alternatively, in a preferred embodiment, an amplifier which produces current digitally in conjunction with a standard digital to analog computer can be utilized to divide the current s that each coil set receives proper current to effect zeroing out of the magnetic field gradients.

The coils are wound or driven to produce asymmetric or symmetric coil pairs. Even z gradients can be made with a set of coils with paired symmetrically wound turns. Odd or even gradients can be produced with a set of coils if they are powered separately and the direction of current is controlled. Odd or even gradients can be produced when a set of coils is wound in pairs and they are wound together. When utilizing superconducting coils, the coils are arranged in parallel and one switch is utilized for more than one coil or timing several switches on and off at the same time for individual sets of loop elements. In practice the coils are wound on a cylinder which then is placed within the bore of the solenoid magnet generating the static magnetic field.

Referring to FIGS. 1 and 2, an NMR spectrometer 10 includes a high yield superconducting magnet 12 having a bore 14 into which is positioned a cylinder 16 on which are mounted radial magnetic coils and axial coils. A probe 18 is positioned within bore 14 and is attached by means of cylinder 20 to a sample retainer 22. The sample retainer 22 includes a plurality of bores 24 into which sample containers can be fit.

Figure 5:
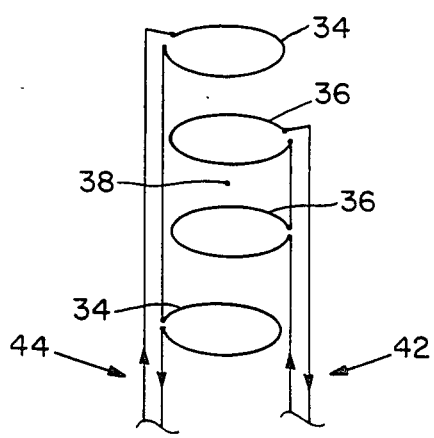
FIG. 5 is a schematic view of the axial coils of this invention to zero out magnetic gradients.

Referring to FIGS. 3,4 and 5, the cylinder 18 has mounted thereon a plurality of rows of radial saddle shaped coils 26, 28, 30 and 32 which are connected to digital to analog (D/A) amplifiers (not shown). The D/A amplifier together with suitable microprocessing means serve to control the current in each coil in order to zero out orders of magnetic gradient of the magnetic field. The plurality of layers of radial coils are mounted on the outside surface of cylinder 18 by employing an insulating layer between adjacent layers of radial coils. The axial coils 34 and 36 (See FIG. 5) are mounted on the inside surface of cylinder 18 about static magnetic field center 38. The coils are provided with conventional current feeds 40, 42 and 44.

We claim:

1. High resolution nuclear magnetic resonance apparatus for concurrent analysis of discrete samples which comprises:

nuclear magnetic resonance analysis apparatus adapted to analyze concomitantly a plurality of samples at rest, a sample container adapted to retain a plurality of discrete samples in a solvent, said samples being retained in radially discrete positions within a volume of a magnet within said apparatus having a substantially homogeneous static magnetic field, and a cylinder positioned within the volume of said magnet and having mounted thereon a plurality of electrically conducting coils designed to zero out at least the first 6 orders of the spherical harmonic expansion of gradient of a static magnetic field generated by said magnet.

2. Nuclear magnetic resonsance apparatus for concurrent analysis of discrete samples which comprises:

nuclear magnetic resonance analysis apparatus adapted to analyze concomitantly a plurality of samples at rest, a sample container adapted to retain a plurality of discrete samples in a solvent, said samples being retained in radially discrete positions within a volume of a magnet within said apparatus having a substantially homogeneous static magnetic field, a cylinder positioned within the volume of said magnet and having mounted thereon a plurality of electrically conducting coils designed to zero out at least the first 6 orders of the spherical harmonic expansion of gradient of a static magnetic field generated by said magnet, and a plurality of signal detection channels, each arranged to couple with one of said samples, and each of said channels communicating with a radio frequency processing apparatus to obtain from said samples resonance spectra.

3. Apparatus having a volume of homogeneous static magnetic field which comprises a magnet generating a static magnetic field, a bore within said magnet, a plurality of radial magnetic coils positioned within said bore and sufficient to zero out at least the first 6 orders of the spherical harmonic expansion of gradient of a static magnetic field generated by said magnet, a plurality of axial magnetic coils positioned within said bore and means for passing current through said radial magnetic coils and said axial magnetic coils to minimize magnetic gradients in said static magnetic field.

* * * * *